United States Patent
Huang

(10) Patent No.: US 6,639,306 B2
(45) Date of Patent: *Oct. 28, 2003

(54) SEMICONDUCTOR PACKAGE HAVING A DIE PAD WITH DOWNWARD-EXTENDED TABS

(75) Inventor: Chien-Ping Huang, Hsinchu (TW)

(73) Assignee: Siliconware Precision Industries, Co., Ltd. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/363,994

(22) Filed: Jul. 29, 1999

(65) Prior Publication Data

US 2001/0033011 A1 Oct. 25, 2001

(30) Foreign Application Priority Data

Jul. 30, 1998 (TW) ........................................ 87112517 A

(51) Int. Cl.[7] ...................... H01L 23/495; H01L 23/28
(52) U.S. Cl. ...................... 257/667; 257/666; 257/669; 257/676; 257/787
(58) Field of Search .................. 257/666, 667–669, 257/787, 676

(56) References Cited

U.S. PATENT DOCUMENTS

| | | | |
|---|---|---|---|
| 4,952,999 A | * 8/1990 | Robinson et al. | ............. 357/68 |
| 5,371,044 A | 12/1994 | Yoshida et al. | |
| 5,578,871 A | * 11/1996 | Fierkens | ...................... 257/676 |
| 5,623,162 A | 4/1997 | Kurihara | |
| 5,942,794 A | * 8/1999 | Okumura et al. | ............ 257/666 |
| 6,081,029 A | * 6/2000 | Yamaguchi | .................. 257/718 |

FOREIGN PATENT DOCUMENTS

| | | | | |
|---|---|---|---|---|
| JP | 401122143 | * | 5/1989 | ..................... 23/50 |
| JP | 402133951 | * | 5/1990 | ..................... 23/50 |
| JP | 05047979 | * | 2/1993 | ..................... 23/50 |
| JP | 405082706 | * | 4/1993 | ..................... 23/50 |
| JP | 406029448 | * | 2/1994 | ..................... 23/50 |
| JP | 406132443 | * | 5/1994 | ..................... 23/50 |

* cited by examiner

*Primary Examiner*—Steven Loke
*Assistant Examiner*—Nitin Parekh
(74) *Attorney, Agent, or Firm*—Peter F. Corless; Steven M. Jensen; Edwards & Angell, LLP

(57) ABSTRACT

A semiconductor package having a lead frame formed with a die pad and a plurality of conductive leads, wherein the die pad is formed with a plurality of tabs to impede the resin flow below the die pad such that a downward pressure is produced because the resin flow above the die pad moves at a speed faster than that below the die pad. As a result, the tab is urged against a bottom surface of a mold cavity during a transfer molding process so as to prevent the die pad from being exposed to an encapsulant for encapsulating the die pad and a semiconductor die mounted on the die pad.

9 Claims, 4 Drawing Sheets

(A)  (B)  (C)

(D)  (E)  (F)

(G)  (H)  (I)

SEMICONDUCTOR PACKAGE HAVING A DIE PAD WITH DOWNWARD-EXTENDED TABS

FIELD OF THE INVENTION

This invention relates to semiconductor packages, and more particularly to a semiconductor package having a die pad for a semiconductor chip to be mounted thereon.

BACKGROUND OF THE INVENTION

Semiconductor devices are required to be miniaturized in profile in order to cope with the recent tendency of reduction in size and weight of electronic equipments. As a result thin type semiconductor devices, such as TSOP (Thin Small Outline Package), SSOP (Shrink Small Outline Package), and TQFP (Thin Quad Flat Package), are developed to conform to industrial needs.

Illustrated in FIG. 1A is a cross-sectional view of a conventional thin type semiconductor package in the mold injection process. The laminated structure of a die 1 and a die pad 3 on which the die 1 is mounted, is received within a mold cavity 71 of a conventional encapsulating mold 7 composed of an upper mold 4 and a lower mold 5. Melted encapsulating resin 2 is introduced via a gate 6 of the encapsulating mold 7 into the mold cavity 71 and is thereby divided into an upper resin flow 24 passing through the space above the die 1 and a lower resin flow 25 passing through the space below the die pad 3. When the upper resin flow 24 moves at a speed substantially equivalent to the lower resin flow 25, the laminated structure of the die 1 and die pad 3 is kept horizontally stable in the mold cavity 71 until the encapsulating resin 2 completely fills the mold cavity 71, as shown in FIG. 1B.

However, as the size of the chip chances, the velocity of the upper resin flow 24 would differ from that of the lower resin flow 25. This tends to incline the laminated structure of the die 1 and die pad 3 and thereby results in an adverse effect on the reliability of a semiconductor device. Referring to FIG. 2A, while chip 1' is of a size smaller than the chip 1 of regular size as shown in FIG. 1A, the upper resin flow 24 moves faster than the lower resin flow 25 and incurs pressure against the chip 1' by the upper resin flow 24 greater than that against the die pad 3 by the lower resin flow 25. As a result, the laminated structure of the die 1' and die pad 3 downwardly inclines toward the inner surface 51 of the lower mold 5, so that the die pad 3 will be exposed to the outside of the encapsulant formed by the encapsulating resin 2 at the time the transfer molding process is completed, as shown in FIG. 2B.

Referring to FIG. 3A, while chip 1" is of a size larger an the chip 1 of regular size as shown in FIG. 1A, contrary to what has been described above, the upper resin flow 24 moves slower than the lower resin flow 25 and incurs a pressure against the chip 1" by the upper resin flow 24 smaller than that against the die pad 3 by the lower resin flow 25. As a result, the laminated structure of the chip 1" and die pad 3 inclines upwardly toward the inner surface 41 of the upper mold 4, so that the die 1" and/or gold wires (not shown) for electrically connecting the chip 1" and inner leads (not shown) are exposed to the outside of the encapsulant formed by the encapsulating resin 2 at the time the transfer molding process is completed, as shown in FIG. 3B.

Therefore, to avoid the aforesaid exposures of the die and die pad to the encapsulant from taking place, U.S. Pat. No. 5,371,044 discloses a process for preparing a semiconductor device in which a control plate is used in the molding process to prevent the resin flows above the die and below the die pad from being different in velocity. As shown in FIG. 4, in the U.S. Pat. No. 5,371,044, a control plate 8, which projects inwardly toward the die pad 3 and horizontally extends from the inner edge of a lead frame (not shown), is formed near the gate 6 of the encapsulating mold 7 to balance the velocity of the upper resin flow 24 and that of the lower resin flow 25. However, the control plate 8 is only designed to decrease the velocity of the upper resin flow 24 so that it is substantially equal to that of the lower resin flow 25 where the upper resin flow 24 moves faster than the lower resin flow 25 in transfer molding. Thus, while the size of the chip 1 is increased to cause the lower resin flow 25 to move faster than the upper resin flow 24, the control plate is useless for balancing the upper resin flow 24 and the lower resin flow 25 such that in this case the chip 1 and die pad 3 tend to upwardly incline and are exposed to the encapsulant. Therefore, the use of the control plate of the U.S. Pat. No. 5,371,044 can not effectively solve the problem caused by the velocity unbalance between the upper resin flow and the lower resin flow in the transfer molding process.

Accordingly, as shown in FIG. 5, the U.S. Pat No. 5,623,162 discloses a die pad 3' having a pair of wing leads 8' which outwardly end from a pair of opposing sides of the die pad 3' to the spacing between a pair of adjacent leads 89'. The wing leads 3' are slightly projected from the side surface of the encapsulant 9', as shown in FIG. 6, after the transfer molding process is completed in the transfer molding process, the outer end of the wing lead 8' is sandwiched between the upper mold and the lower mold (not shown) such that the die pad 3' is held in position by means of the wing leads 8'. As a result, the die pad 3' does not have upward or downward slant problem caused by the velocity unbalance between the upper resin flow and the lower resin flow as described above.

Although a die pad constructed with wing leads as disclosed in the U.S. Pat No. 5,623,162 is able to solve the positioning problem of the die pad, it is primarily designed to provide the moisture in the encapsulant with a path to expel the moisture from the encapsulant to the atmosphere while avoiding the crack of the encapsulant caused by the "popcorn" effect, but not to solve the velocity unbalance between the upper resin flow and the lower resin flow in the transfer molding process. Meanwhile, the trimming process for cutting the wing leads is different from the conventional lead cutting/trimming process. As a result, it becomes necessary to incorporate an additional wing lead trimming step to the packaging process and to use equipment different from conventional ones, whereby the manufacturing cost is undesirably increased. Further, the die pad formed with wing leads increases the material cost for the lead frame, resulting in the wing-lead design not being widely accepted in the industry.

SUMMARY OF THE INVENTION

The present invention was made in accordance with the circumstances of the prior art, and therefore the object of the present invention is to provide a semiconductor package having a die pad with downward-extended tabs which allows the die pad to be maintained in position and not to be exposed to the encapsulant in the transfer molding process without increasing the material cost and packaging cost and using additional treatment process and equipment.

The above and other objects of the present invention are achieved by a semiconductor package comprising a semiconductor chip, a die pad for bearing the semiconductor chip, a plurality of leads each having an inner lead electrically connected with electrode pads disposed on the semiconductor chip by bonding wires such as gold wires, and an encapsulant formed by a molding resin for encapsulant the semiconductor chip, the die pad, and the inner leads of the leads The die pad is formed with a plurality of tabs extending downwardly from the plane where the die pad is positioned, allowing a lower resin flow of the molding resin flowing below the die pad to move slower than an upper resin flow of the molding resin flowing above the die in the molding process. Thus, a downward pressure is produced to press the die pad with the die mounted thereon until the tab of the die pad reaches the inner source of a mold cavity of a mold for forming the encapsulant.

The above and other objects, features and advantages of the present invention will be apparent from the following description of preferred embodiments of the invention with reference to the accompanying drawings. It is important to point out that the illustrations may not necessarily be drawn to scale, and that there may be other embodiments of the present invention that are not specifically illustrated.

BRIEF DESCRIPTION OF THE DRAWING

FIG. 7 is a top view illustrating a lead frame used for a first embodiment of the present invention. As shown therein, a lead frame 30 is formed with a die pad 31 in a rectangular shape for bearing a semiconductor die (not shown in FIG. 7) and a plurality of conductive leads 32 surrounding the die pad 31. A pair of hanger bars 33 outwardly extending from a pair of opposing sides of the die pad 31 to both sides of the lead frame 30 are provided for supporting the die pad 31. The die pad 31 is also formed with a plurality of tabs 34 downwardly extending from the plane of the die pad 31 and disposed along another pair of opposite sides of the die pad 31 orthogonal to the pair of sides from which the hanger bars 33 extend. The tabs 34 can be formed by a conventional punching method or the like at the time the lead frame 31 is made. By punching, etching, stamping or similar methods, the tab 34 is to be formed in the peripheral sides of the die pad 31 and/or in the edges of an opening of the die pad 31 (not shown in FIG. 7) and in a triangular, plate shape so that the planarity of the die pad 31 can be maintained after the die pad 31 is formed with the tabs 34. The tab 34 which is in a triangular, plate shape rather than in a protrusion or recess form can also prevent voids from incurring in the encapsulant for encapsulating the die pad 31, as will be depicted in the following, during transfer molding. In addition, the die pad 31 can be either in or downset from the plane of the leads 32.

Referring to FIG. 8, it is illustrated that a transfer molding process is performed to encapsulate the die pad 31 of the lead frame 30. As seen in the drawing, a die 10 is mounted on the die pad 31 by die attaching adhesive such as silver paste (not shown) and electrically connected with the leads 32 by gold wires 20. When the wire bonding process is completed, the lead frame 30 on which the die 10 is mounted is positioned between an upper mold 61 and a lower mold 62 of an encapsulating mold 60. A mold cavity 63 formed by the combination of a recess on the upper mold 61 and that on the lower mold 62 is used to receive the die pad 31 and the die 10 attached thereto. During the transfer molding process, an encapsulating resin 70 is introduced via a gate 64 formed on the upper mold 61 into the mold cavity 63 so as to completely encapsulate the die 10, gold wires 20, die pad 31, and inner portions of the leads 32. As aforementioned, when the resin flow introduced from the gate 64 into the mold cavity 63 reaches the die pad 31, the encapsulating resin 70 is diverted by the die 10 and die pad 31 so that a portion of the encapsulating resin 70 flows above the die 10 and a portion thereof flows below the die pad 31. Upon passing the tabs 34 of the die pad 31, the resin flow below the die pad 31 is impeded by the downwardly extended tabs 34 such that the resin flow above the die 10 moves at a speed faster than that below the die pad 31, resulting in a downward pressure against the die pad 31 and die 10 downwardly pressing the die pad 31 and die 10. The tabs 34 of the die pad 31 abut against the inner surface of the lower mold 62, as shown in FIG. 8; the die pad 31 and die 10 are kept in position in the mold cavity 63 whereby the die pad 31 is prevented from being exposed to the encapsulant formed by the encapsulating resin 70 by the abutting of the tabs 34 against the lower mold 62.

Figure 1A:
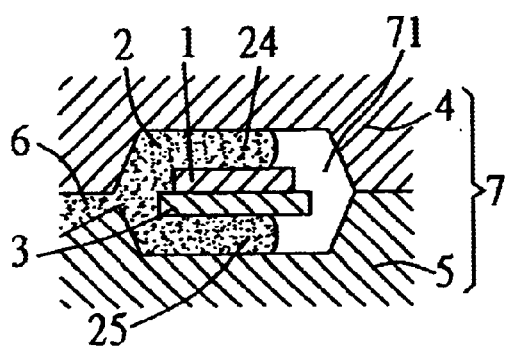
FIG. 1A is a cross-sectional view which illustrates during a transfer molding process a molding resin introduced from a gate into the cavity of a mold within which a conventional die pad with a die of standard size mounted thereon is disposed.
Figure 1B:
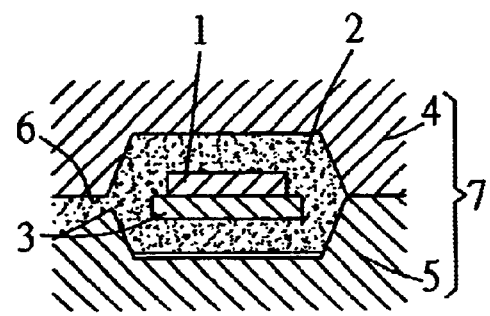
FIG. 1B is a cross-sectional view showing that the molding process of FIG. 1A is completed and the die pad is kept in position in the cavity of the mold.
Figure 2A:
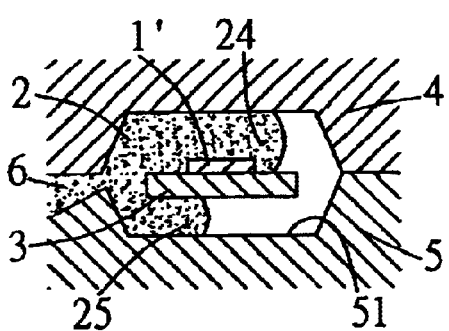
FIG. 2A is a cross-sectional view which illustrates during a transfer molding process a molding resin introduced from a gate into the cavity of a mold within which a conventional die pad with a die of small size mounted thereon is disposed.
Figure 2B:
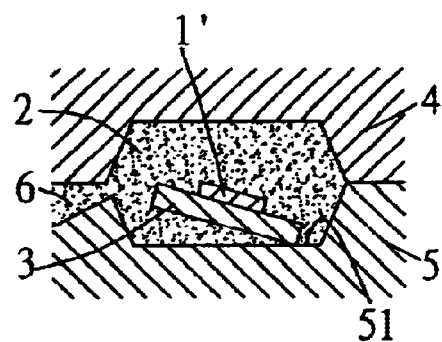
FIG. 2B is a cross-sectional view showing that the molding process of FIG. 2A is completed and the die pad downwardly inclines and is exposed to the encapsulant.
Figure 3A:
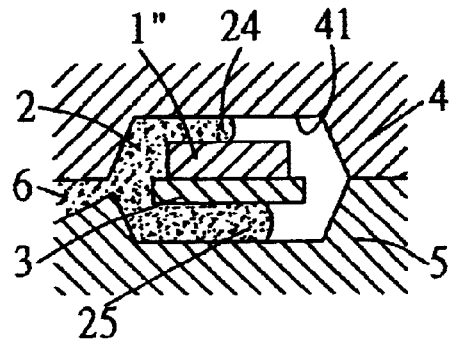
FIG. 3A is a cross-sectional view which illustrates during a transfer molding process a molding resin introduced from a gate into the cavity of a mold within which a conventional die pad with a die of large size mounted thereon is disposed.
Figure 3B:
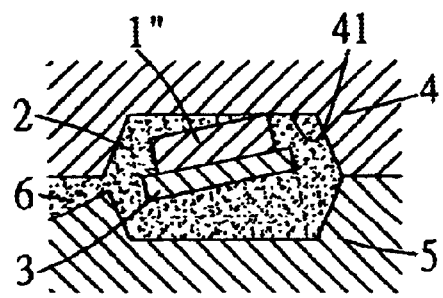
FIG. 3B is a cross-sectional view showing that the molding process of FIG. 3A is completed and the die pad upwardly inclines and is exposed to the encapsulant.
Figure 4:
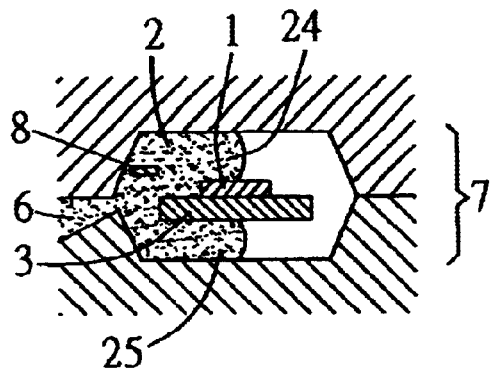
FIG. 4 is a cross-sectional view showing another conventional semiconductor package in the transfer molding process of which the lead fame is formed with a control plate.

The tab 34 has a height substantially corresponding to or slightly lower or higher than the distance between the bottom surface of the die pad 31 and that of the mold cavity 63. Also, the tab 34 is preferably formed in a triangular shape with a corner end pointing toward the bottom surface of the mold cavity 63. Therefore, as the transfer molding process is completed, merely the corner ends of the tabs 34 may be exposed to the encapsulant formed by the encapsulating resin 70 such that the reliability of the semiconductor package thus-obtained is secured. Furthermore, in the case that the corner ends of the tabs 34 are exposed to the encapsulant, the tabs 34 also provide the semiconductor package of the present invention with a path for expelling the moisture within the encapsulant to the atmosphere so that the occurrence of crack or "popcorn" in the package can be eliminated. Also by way of the tabs 34, the heat generated by the die 10 can be directly dissipated to the atmosphere or to an externally attached heatspreader or heat block so that the heat dissipation of the semiconductor package of the present invention will be enhanced.

Figure 7:
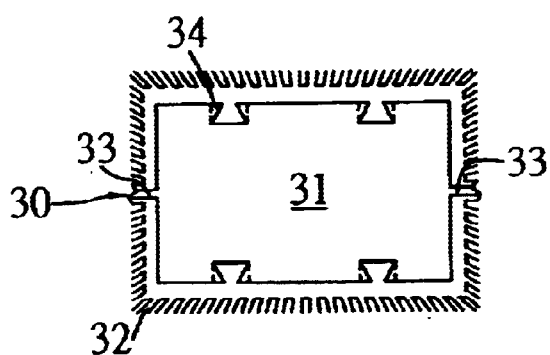
FIG. 7 is a top view of a lead frame suitable for use in a semiconductor package in accordance with the first embodiment of the present invention.
Figure 8:
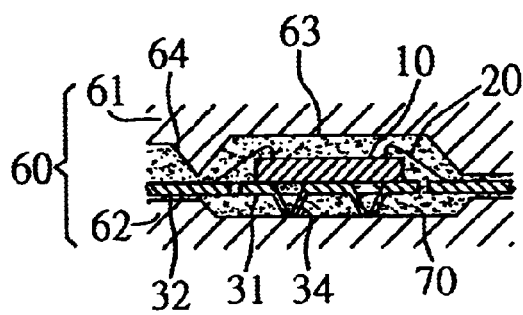
FIG. 8 is a cross-sectional view of the die pad of FIG. 7 having a die mounted thereon and disposed in the cavity of a mold in the transfer molding process.
Figure 9:
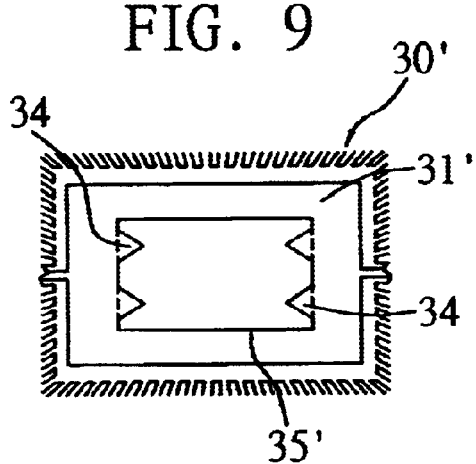
FIG. 9 is a top view of a lead frame suitable for use in a semiconductor package in accordance with the second embodiment of the present invention.

Referring to FIG. 9, there is shown a lead frame for use in a semiconductor package of a second embodiment of the present invention. In FIG. 9, elements corresponding to those shown in FIG. 7 are given the same reference numerals while their explanation is here omitted for the sake of simplifying the desertion.

Figure 10:
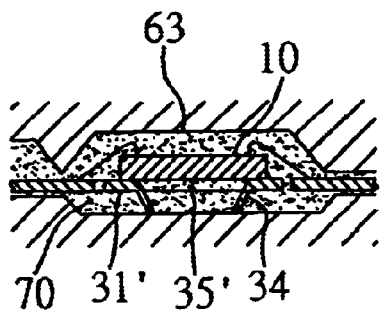
FIG. 10 is a cross-sectional view of the die pad of FIG. 9 having a die mounted thereon and disposed in the cavity of a mold in the transfer molding process.
Figure 5:
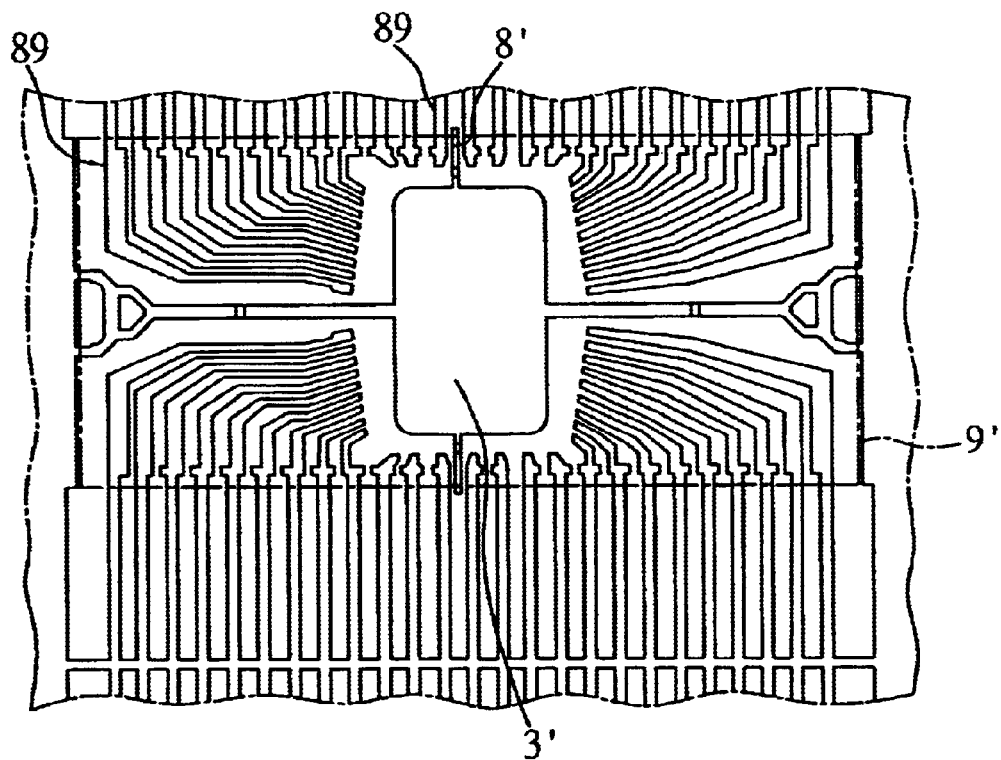
FIG. 5 is a top view which illustrates a lead frame for a further conventional semiconductor package having wing leads.
Figure 6:
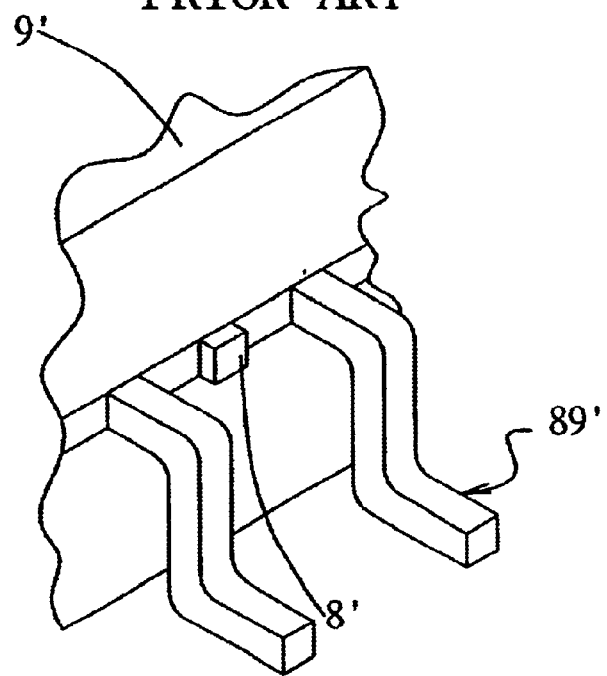
FIG. 6 is a partial perspective view which illustrates the portion of the wing lead of the lead frame of FIG. 5 projected from the encapsulant.
Figure 11:
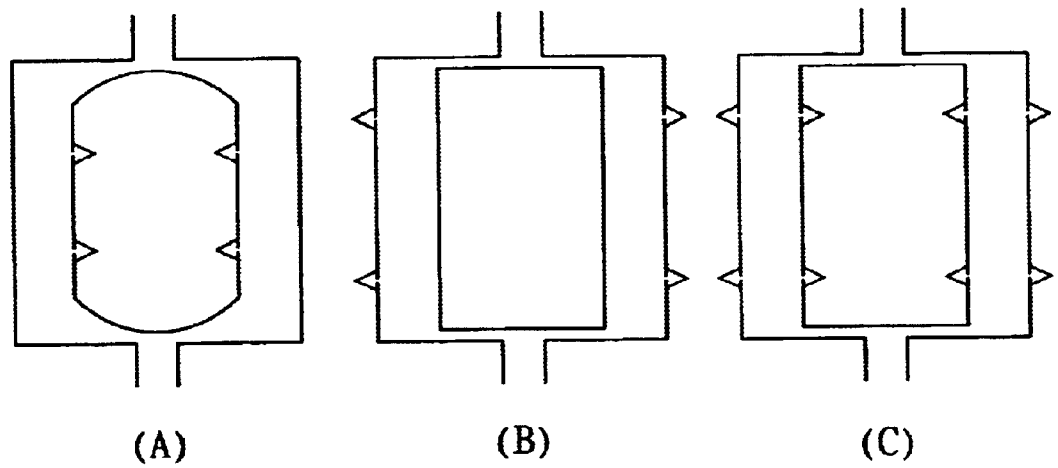
FIGS. 11A to 11I are top views in accordance with other embodiments of the present invention.
Figure 11:
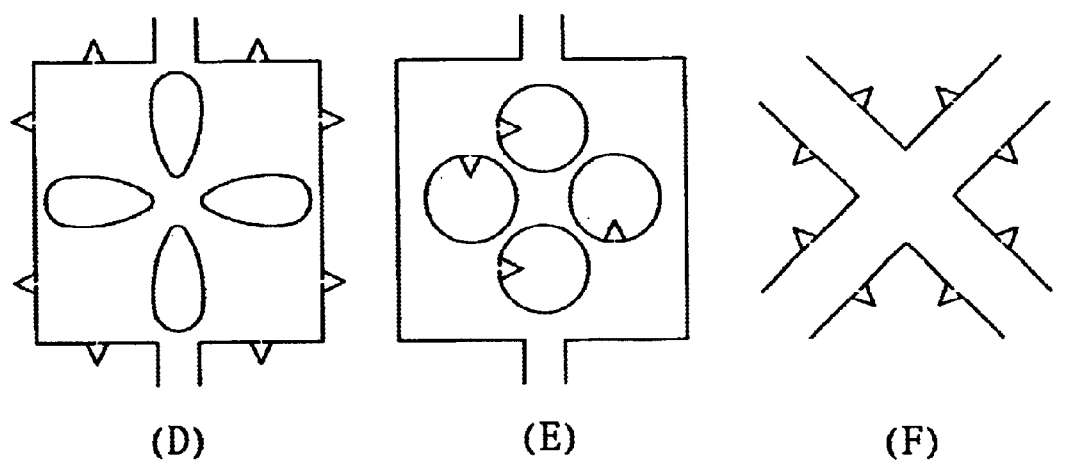
Figure 11:
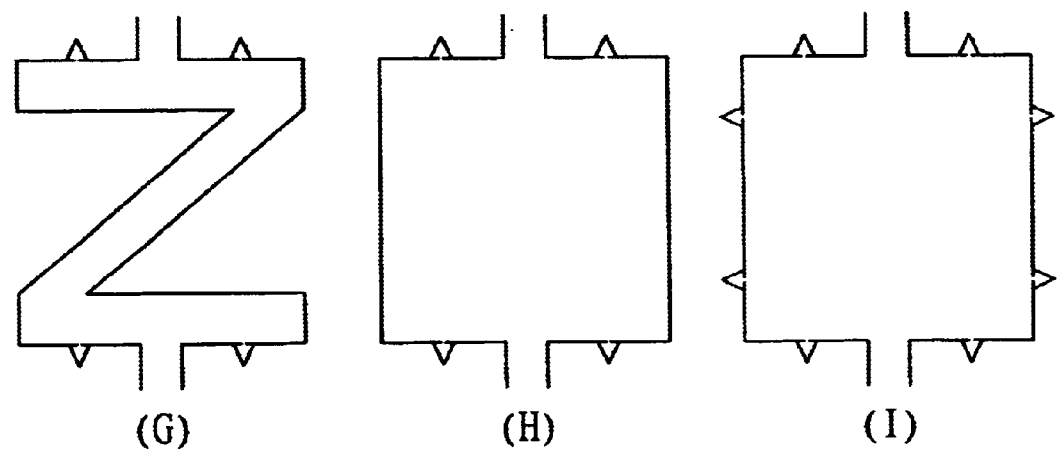

As seen from FIG. 9, the lead frame 30' in accordance with the second embodiment of the present invention has a die pad 31' with a rectangular opening 35' formed in the center thereof and a plurality of tabs 34 formed in a pair of opposing edges of the opening 35'. The formation of the opening 35' on the die pad 31' is to decrease the adhesion area of a die 10 adhered to the die pad 31' whereby delamination between the die 10 and die pad 31' is eliminated. The tab 34 also has a height substantially corresponding to or slightly lower than the distance between the bottom source of the die pad 31' and that of the mold cavity 63, as shown in FIG. 10. Accordingly, when the transfer molding process is completed. Merely the tip ends of the tabs 34 instead of the die pad 31' are exposed to the encapsulant formed by the encapsulating resin 70.

As seen from the above, the present invention has been described hitherto with exemplary preferred embodiments. However, it is to be understood that the scope of the present invention need not be limited to the disclosed preferred embodiments. It should also be noted that the present invention is in no way limited to the details of the illustrated structures and shapes but changes and modifications, such as those shown in FIGS. 11A to 11I, can be made within the scope of the appended claims.

What is claimed is:

1. A semiconductor package comprising:

a semiconductor chip;

a lead frame having a die pad defining a die-attach region for bearing the semiconductor chip, and a plurality of leads for electrically coupling to the semiconductor chip, wherein the die pad is formed at a peripheral region surrounding the die attach region with a plurality of triangularly-shaped tabs downwardly extending from the plane of the die pad in a manner that the tabs are free of interference from contact between the semiconductor chip and the die pad, and the tabs impede mold flow of an encapsulating compound used for encapsulating the semiconductor chip; and an encapsulant formed of the encapsulating compound for encapsulating the semiconductor chip, the die pad, and inner portions of the leads;

wherein at least one tab has a height higher than the distance between a bottom surface of the die pad and a surface, facing the bottom of the die pad, of a mold cavity of an encapsulating mold used for a transfer molding.

2. The semiconductor package of claim 1, wherein the leads are electrically coupled to the semiconductor chip by bonding wires.

3. The semiconductor package of claim 1, wherein the die pad has at least one opening formed in the center.

4. The semiconductor package of claim 1, wherein the tab is integrally formed with the die pad.

5. The semiconductor package of claim 1, wherein the die pad is positioned in the plane of the leads.

6. The semiconductor package of claim 1, wherein the die pad is downset from the plane of the leads.

7. The semiconductor package of claim 1 wherein each tab has a triangular shape with a corner end of the tab pointing toward a bottom surface of a mold cavity of an encapsulating mold used for a transfer molding that contains the semiconductor package.

8. A semiconductor package comprising:

a semiconductor chip;

a lead frame having a die pad for bearing the semiconductor chip, and a plurality of leads for electrically coupling to the semiconductor chip, wherein the die pad is formed with at least an opening dimensioned smaller than a surface area of the semiconductor chip, allowing a bottom surface of the semiconductor chip to be partially exposed to the opening, and a plurality of triangularly-shaped tabs protrude upwardly from a peripheral edge of the opening and downwardly extend from the plane of the die pad in a manner that the tabs are free of interference from contact between the semiconductor chip and the die pad, and the tabs impede mold flow of an encapsulating compound used for encapsulating the semiconductor chip;

an encapsulant formed of the encapsulating compound for encapsulating the semiconductor chip, the die pad, and inner portions of the leads; and the semiconductor package contained within a mold cavity of an encapsulating mold used to produce the semiconductor package by transfer molding;

wherein at least one tab has a height higher than the distance between a bottom surface of the die pad and a surface, facing the bottom of the die pad, of a mold cavity of an encapsulating mold used for a transfer molding.

9. The semiconductor package of claim 8 wherein each tab has a triangular shape with a corner end of the tab pointing toward a bottom surface of a mold cavity of an encapsulating mold used for a transfer molding that contains the semiconductor package.

\* \* \* \* \*